United States Patent
Mao et al.

(10) Patent No.: US 9,018,881 B2
(45) Date of Patent: Apr. 28, 2015

(54) STATOR WINDING DIAGNOSTIC SYSTEMS AND METHODS

(71) Applicant: GM Global Technology Operations LLC, Detroit, MI (US)

(72) Inventors: Xiaofeng Mao, Novi, MI (US); Lei Hao, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 182 days.

(21) Appl. No.: 13/738,123

(22) Filed: Jan. 10, 2013

(65) Prior Publication Data

US 2014/0191697 A1    Jul. 10, 2014

(51) Int. Cl.
  *H02P 1/00*    (2006.01)
  *H02P 3/00*    (2006.01)
  *H02P 5/00*    (2006.01)
  *H02P 29/02*   (2006.01)

(52) U.S. Cl.
  CPC .................................. *H02P 29/021* (2013.01)

(58) Field of Classification Search
  USPC ............ 318/490, 696, 400.01, 400.3; 361/24, 361/78
  See application file for complete search history.

(56) References Cited

U.S. PATENT DOCUMENTS

| | | | | |
|---|---|---|---|---|
| 4,458,192 A | * | 7/1984 | Sakamoto et al. | 318/798 |
| 4,461,986 A | * | 7/1984 | Maynard et al. | 318/728 |
| 5,252,915 A | * | 10/1993 | Sedding et al. | 324/765.01 |
| 5,270,640 A | * | 12/1993 | Kohler et al. | 324/765.01 |
| 5,304,910 A | * | 4/1994 | Loncle et al. | 318/696 |
| 5,434,738 A | * | 7/1995 | Kurszewski et al. | 361/23 |
| 5,517,102 A | * | 5/1996 | Jensen | 318/701 |
| 5,565,753 A | * | 10/1996 | Chen et al. | 318/809 |
| 6,043,664 A | * | 3/2000 | Kliman et al. | 324/545 |
| 6,069,467 A | | 5/2000 | Jansen | |
| 6,137,418 A | * | 10/2000 | Zuercher et al. | 340/648 |
| 6,141,196 A | * | 10/2000 | Premerlani et al. | 361/78 |
| 6,144,924 A | * | 11/2000 | Dowling et al. | 702/60 |
| 6,172,509 B1 | * | 1/2001 | Cash et al. | 324/546 |
| 6,236,227 B1 | * | 5/2001 | Kliman et al. | 324/765.01 |
| 6,236,947 B1 | * | 5/2001 | Dowling et al. | 702/38 |
| 6,308,140 B1 | * | 10/2001 | Dowling et al. | 702/60 |
| 6,427,104 B1 | * | 7/2002 | Matsushita et al. | 701/41 |

(Continued)

OTHER PUBLICATIONS

"Report of Large Motor Reliability Survey of Industrial and Commercial Installations. Part 1," IEEE Transactions on Industry Applications, Jul. 1985, pp. 853-864, vol. IA-21, No. 4.

(Continued)

*Primary Examiner* — Paul IP
(74) *Attorney, Agent, or Firm* — Ingrassia Fisher & Lorenz, P.C.

(57) ABSTRACT

Systems and methods are provided for diagnosing stator windings in an electric motor. An exemplary method for diagnosing stator windings in an electric motor involves determining an input energy imbalance across phases of the stator windings for an electrical period of the electric motor and identifying a fault condition when the input energy imbalance is greater than a first threshold value. In some embodiments, an input energy ratio across phases of the stator windings is also determined for the electrical period, wherein the fault condition is identified as a phase-to-phase short circuit fault condition when the input energy ratio is greater than a second threshold value and the input energy imbalance is greater than the first threshold value, or alternatively, as an in-phase short circuit fault condition when the input energy ratio is less than the second threshold value.

16 Claims, 2 Drawing Sheets

(56) References Cited

U.S. PATENT DOCUMENTS

| | | | |
|---|---|---|---|
| 6,462,491 B1 | 10/2002 | Iijima et al. | |
| 6,566,830 B2 | 5/2003 | Walters | |
| 6,590,362 B2* | 7/2003 | Parlos et al. | 318/799 |
| 6,611,771 B1* | 8/2003 | Habetler et al. | 702/58 |
| 6,636,823 B1* | 10/2003 | Unsworth et al. | 702/115 |
| 6,737,833 B2 | 5/2004 | Kalman et al. | |
| 6,741,060 B2 | 5/2004 | Krefta et al. | |
| 6,768,935 B1 | 7/2004 | Morgan et al. | |
| 6,828,752 B2 | 12/2004 | Nakatsugawa et al. | |
| 6,838,844 B2 | 1/2005 | Shimizu et al. | |
| 6,838,848 B2 | 1/2005 | Shindo | |
| 7,075,260 B2 | 7/2006 | Maeda | |
| 7,116,068 B2 | 10/2006 | Boesch et al. | |
| 7,116,077 B2 | 10/2006 | Raftari et al. | |
| 7,117,125 B2* | 10/2006 | Dimino et al. | 702/185 |
| 7,119,530 B2* | 10/2006 | Mir et al. | 324/76.15 |
| 7,151,354 B2 | 12/2006 | Yoshinaga et al. | |
| 7,176,652 B2 | 2/2007 | Wakabayashi et al. | |
| 7,231,319 B2* | 6/2007 | Dimino et al. | 702/185 |
| 7,243,006 B2 | 7/2007 | Richards | |
| 7,286,906 B2 | 10/2007 | Richards | |
| 7,336,455 B2* | 2/2008 | Dimino et al. | 361/24 |
| 7,346,475 B2* | 3/2008 | Dimino et al. | 702/185 |
| 7,474,067 B2 | 1/2009 | Ueda et al. | |
| 7,489,097 B2* | 2/2009 | Fu et al. | 318/400.01 |
| 7,577,545 B2 | 8/2009 | Hu | |
| 7,579,736 B2* | 8/2009 | Nishino et al. | 310/198 |
| 7,671,552 B2 | 3/2010 | Tonamai et al. | |
| 7,768,220 B2 | 8/2010 | Schulz et al. | |
| 8,044,678 B2 | 10/2011 | Kao et al. | |
| 8,054,084 B2 | 11/2011 | Schulz et al | |
| 8,065,050 B2* | 11/2011 | West et al. | 701/34.1 |
| 8,164,297 B2* | 4/2012 | Tan et al. | 318/807 |
| 8,253,365 B2* | 8/2012 | Yeh | 318/490 |
| 8,330,407 B2* | 12/2012 | Moreira | 318/490 |
| 8,354,817 B2* | 1/2013 | Yeh et al. | 318/812 |
| 8,362,732 B2* | 1/2013 | Anwar et al. | 318/490 |
| 8,405,339 B2* | 3/2013 | Zhang et al. | 318/490 |
| 8,497,698 B2* | 7/2013 | Yeh | 324/765.01 |
| 2002/0145837 A1 | 10/2002 | Krefta et al. | |
| 2003/0034751 A1 | 2/2003 | Walters | |
| 2003/0062868 A1 | 4/2003 | Mir et al. | |
| 2003/0067277 A1* | 4/2003 | Parlos et al. | 318/254 |
| 2003/0086222 A1 | 5/2003 | Stoupis et al. | |
| 2003/0107339 A1 | 6/2003 | Shimizu et al. | |
| 2003/0193310 A1 | 10/2003 | Raftari et al. | |
| 2003/0227271 A1 | 12/2003 | Shindo | |
| 2004/0103719 A1 | 6/2004 | Raftari et al. | |
| 2004/0109267 A1* | 6/2004 | Habetler | 361/23 |
| 2004/0134267 A1 | 7/2004 | Boesch et al. | |
| 2004/0169482 A1 | 9/2004 | Maeda | |
| 2004/0239272 A1* | 12/2004 | Schulz et al. | 318/439 |
| 2005/0021301 A1* | 1/2005 | Dimino et al. | 702/185 |
| 2005/0021302 A1* | 1/2005 | Dimino et al. | 702/185 |
| 2005/0029972 A1 | 2/2005 | Imai et al. | |
| 2005/0073280 A1 | 4/2005 | Yoshinaga et al. | |
| 2006/0001392 A1* | 1/2006 | Ajima et al. | 318/432 |
| 2006/0138992 A1 | 6/2006 | Yamamoto | |
| 2006/0176059 A1* | 8/2006 | Mir et al. | 324/503 |
| 2006/0192512 A1 | 8/2006 | Maeda | |
| 2006/0192513 A1 | 8/2006 | Maeda | |
| 2006/0192516 A1 | 8/2006 | Maeda | |
| 2006/0196265 A1* | 9/2006 | Dimino et al. | 73/460 |
| 2006/0214529 A1* | 9/2006 | Nishino et al. | 310/198 |
| 2007/0005291 A1* | 1/2007 | Habetler et al. | 702/145 |
| 2007/0052381 A1 | 3/2007 | Ueda et al. | |
| 2007/0069682 A1* | 3/2007 | Ide et al. | 318/719 |
| 2007/0078576 A1 | 4/2007 | Salman et al. | |
| 2008/0300820 A1 | 12/2008 | Hu | |
| 2009/0021194 A1 | 1/2009 | Tonamai et al. | |
| 2009/0114471 A1* | 5/2009 | Nagase et al. | 180/446 |
| 2009/0189561 A1 | 7/2009 | Patel et al. | |
| 2009/0198408 A1 | 8/2009 | Salman et al. | |
| 2009/0261770 A1 | 10/2009 | Fujishiro et al. | |
| 2009/0261774 A1 | 10/2009 | Yuuki et al. | |
| 2009/0271060 A1* | 10/2009 | West et al. | 701/30 |
| 2010/0169030 A1 | 7/2010 | Parlos | |
| 2010/0231150 A1* | 9/2010 | Tan et al. | 318/400.3 |
| 2010/0295491 A1 | 11/2010 | Schulz et al. | |
| 2010/0320953 A1* | 12/2010 | Yeh et al. | 318/490 |
| 2011/0089882 A1* | 4/2011 | Yeh | 318/490 |
| 2011/0187304 A1* | 8/2011 | Anwar et al. | 318/490 |
| 2012/0038304 A1 | 2/2012 | Yeh | |

OTHER PUBLICATIONS

"Report of Large Motor Reliability Survey of Industrial and Commercial Installations, Part II," IEEE Transactions on Industry Applications, Jul. 1985, pp. 865-872, vol. IA-21, No. 4.

Albrecht, P.F. et al., "Assessment of the Reliability of Motors in Utility Applications- Updated," IEEE Transactions on Energy Conversions, Mar. 1986, pp. 39-46, vol. EC-1, No. 1.

Bonnett, A. H. et al., "Cause and analysis of stator and rotor failures in three-phase squirrel-cage induction motors," IEEE Transactions on Industry Applications, Jul./Aug. 1992, pp. 921-937, vol. 28, No. 4.

Kilman, G.B. et al., "A new approach to on-line turn fault detection in AC motors," IEEE Transactions on Industry Applications, 1996, pp. 687-693, vol. 1, San Diego, CA, USA.

Kohler, J.L. et al., "Alternatives for assessing the electrical integrity of induction motors," IEEE Transactions on Industry Applications, Sep. Oct. 1992, pp. 1109-1117, vol. 28, No. 5.

Siddique, A. et al., "Applications of artificial intelligence techniques for induction machine stator fault diagnostics: review," IEEE International Symposium on Diagnostics for Electric Machines, Power Electronics and Drives, Aug. 2003, pp. 29-34, Voi/No. 24-26.

Khan, M.A.S.K. et al., "Real-Time Implementation of Wavelet Packet Transform-Based Diagnosis and Protection of Three-Phase Induction Motors," IEEE Transactions on Energy Conversions, Sep. 2007, pp. 647-655, vol. 22, No. 3.

Briz, F. et al., "Online stator winding fault diagnosis in inverter-fed AC machines using high-frequency signal injection," IEEE Transactions on Industry Applications Conference, Jul./Aug. 2003, pp. 1109-1117, vol. 39, No. 4.

Trutt, F.C. et al., "Detection of AC machine winding deterioration using electrically excited vibrations," IEEE Transactions on Industry Applications, Jan./Feb. 2001, pp. 10-14, vol. 37, No. 1.

Mirafzal, B. et al., "Interturn Fault Diagnosis in Induction Motors Using the Pendulous Oscillation Phenomenon," IEEE Transactions on Energy Conversions, Dec. 2006, pp. 871-882, vol. 21, No. 4.

Penman. J. et al., "Detection and location of intertum short circuits in the stator windings of operating motors," IEEE Transactions on Energy Conversion, Dec. 1994, pp. 652-658, vol. 9, No. 4.

Briz, F. et al., "Induction machine diagnostics using zero sequence components," IEEE Transactions on Industry Applications Conference, 2005, Oct. 2005, pp. 34-41, vol. 1, No. 2-6.

Cruz, S. M. A. et al., "Stator winding fault diagnosis in three-phase synchronous and asynchronous motors, by the extended park's vector approach," IEEE Transactions on Industry Applications Conference, 2000, Sep./Oct. 2001, pp. 1227-1233, vol. 37, No. 5.

Cruz, S. M. A. et al., "DSP implementation of the multiple reference frames theory for the diagnosis of stator faults in a DTC induction motor drive," IEEE Transactions on Energy Conversion, Jun. 2005, pp. 329-335, vol. 20, No. 2.

Grubic, S. et al. "A survey on testing and monitoring methods for stator insulation systems of low-voltage induction machines focusing on turn insulation problems," IEEE Transactions on Industrial Electronics, Dec. 2008, pp. 4127-4136, vol. 55, No. 12.

Filippetii, F. et al., "AI Techniques in Induction Machines Diagnosis Including the Speed Ripple Effect," IEEE Transactions on Industry Applications, Jan./Feb. 1998, vol. 34, No. 1.

Cruz, S.Ma et al., "Diagnosis of Stator, Rotor and Airgap Eccentricity Faults in Three-Phase Induction Motors Based on the Multiple Reference Frames Theory," IEEE Industry Applications Conference, Oct. 2003, pp. 1340-1346, vol. 2.

Cusido, J. et al., "Fault Detection in Inductions Machines Using Power Spectral Density in Wavelet Decomposition," IEEE Transactions on Industrial Electronics, Feb. 2008, pp. 633-643, vol. 55, No. 2.

(56) References Cited

OTHER PUBLICATIONS

Notice of Allowance dated Apr. 22, 2010. issued in U.S. Appl. No. 12/108,868.

Chapman, P.L., et al. "Optimal Current Control Strategies for Surface-Mounted Permanent-Magnet Synchronous Machine Drives," IEEE Transactions on Energy Conversion, Dec. 1999, pp. 1043-1050, vol. 14, No. 4.

Choi, J-W., et al. "Novel Periodic Torque Ripple Compensation Scheme in Vector Controlled AC Motor Drives," IEEE Applied Power Electronics Conference and Exposition, Feb. 1998, pp. 81-85, vol. 1.

Favre, E. et al. "Permanent-Magnet Synchronous Motors: a Comprehensive Approach to Cogging Torque Suppression," IEEE Transactions on Industry Applications, Nov./Dec. 1993, pp. 1141-1149, vol. 29, No. 6.

Hung, J.Y. et al. "Minimization of Torque Ripple in Permanent Magnet Motors: a Closed Form Solution," IEEE Power Electronics and Motion Control, 1992, pp. 459-463, vol. 1.

Le-Huy, H., et al. "Minimization of Torque Ripple in Brushless DC Motor Drives," IEEE Transactions on Industry Applications, Jul./Aug. 1986, pp. 748-755, vol. IA-22, No. 4.

Kang, C. et al. "An Efficient Torque Control Algorithm for BLDCM with a General Shape of Back EMF," 24th Annual IEEE Power Electronics Specialist Conference, 1993, pp. 451-457.

Lee, S. et al. "A Harmonic Reference Frame Based Current Controller for Active Filter," IEEE School of Electrical Engineering, 2000, pp. 1073-1078, 2000.

Lu, C.W. et al. "Novel Approach to Current Profiling for AC Permanent Magnet Motors," IEEE Transactions on Energy Conversion, Dec. 1999, pp. 1294-1299, vol. 14, No. 4.

Wu, A.P. et al. "Cancellation of Torque Ripple Due to Nonidealities of Permanent Magnet Synchronous Machine Drives," IEEE Power Electronics Specialist Conference, 2003, pp. 256-261, vol. 1.

Benbouzid, M. E-H., "A Review of Inductions Motors Signature Analysis as a Medium for Faults Detection," IEEE Transactions on Industrial Electronics, Oct. 2000, pp. 984-993, vol. 47, No. 5.

Bellini. A.. et al., "Quantitative Evaluation of Induction Motor Broken Bars by Means of Electrical Signature Analysis," IEEE Transactions on Industry Applications, Sep./Oct. 2001, pp. 1248-1255, vol. 37, No. 5.

Douglas, H. et al., "Broken Rotor Bar Detection in Induction Machines With Transient Operating Speeds," IEEE Transactions on Energy Conversion, Mar. 2005, pp. 135-141, vol. 20, No. 1.

Yazici, B. et al., "An Adaptive Statistical Time-Frequency Method for Detection of Broken Bars and Bearing Faults in Motors Using Stator Current," IEEE Transactions on Industry Applications, Mar./Apr. 1999, pp. 442-452, vol. 35, No. 2.

Kia, S.H. et al., "A High-Resolution Frequency Estimation Method for Three-Phase Induction Machine Fault Detection," IEEE Transactions on Industrial Electronics, Aug. 2007, pp. 2305-2314, vol. 54, No. 4.

Rajagopalan, S. et al., "Detection of Rotor Faults in Brushless DC Motors Operating Under Nonstationary Conditions," IEEE Transactions on Industry Applications, Nov./Dec. 2006, pp. 1464-1477, vol. 42, No. 6.

Blodt, M. et al., "On-Line Monitoring of Mechanical Faults in Variable-Speed Induction Motor Drives Using the Wigner Distribution," IEEE Transactions on Industrial Electronics, Feb. 2008, pp. 522-533, vol. 55, No. 2.

Douglas, H. et al., "A New Algorithm for Transient Motor Current Signature Analysis Using Wavelets," IEEE Transactions on Industry Applications, Sep./Oct. 2004, pp. 1361-1368, vol. 40, No. 5.

* cited by examiner

STATOR WINDING DIAGNOSTIC SYSTEMS AND METHODS

TECHNICAL FIELD

Embodiments of the subject matter described herein generally relate to vehicle electrical systems, and more particularly relate to systems and methods for diagnosing fault conditions in the stator windings of an electric motor during operation of an automotive vehicle.

BACKGROUND

In recent years, advances in technology, as well as ever evolving tastes in style, have led to substantial changes in the design of automobiles. Electric motors (or electric machines) are finding an increasing number of applications in the automotive industry due to the electrification of the automotive drive system. Electric and/or hybrid vehicles utilize electric motors as either primary or supplemental torque sources in the automotive drive system. These electric motors are expected to function over extreme operating conditions for an extended period of time with high reliability. However, over time, the operating stresses applied to the electric motor may degrade the condition of the stator windings. For example, thermal stress and/or voltage stress may lead to insulation breakdown, which in turn, may result in partial short-circuiting and/or open-circuiting of individual turns of the stator windings. Accordingly, it is desirable to detect degradation in the stator windings to facilitate maintenance of the motor and ensure reliable operation of the motor throughout the lifetime of the vehicle.

To diagnose the stator windings, some common prior art techniques utilize voltage injection (or current injection), which may potentially influence the operation of the motor. Alternative techniques use Fourier-based analysis or other frequency-domain analysis, which require relatively greater computational resources and corresponding delays in response time. Neural network-based diagnostic techniques have been proposed, however, these are often limited to a particular type of motor and/or require an undesirable amount of time and/or data to train the neural network (e.g., machine learning). Accordingly, it is desirable to provide systems and methods that allow for fault conditions in stator windings to be identified as quickly as possible without requiring a significant increase in computational resources or potentially interfering with otherwise normal operation of the motor. Furthermore, other desirable features and characteristics of the present invention will become apparent from the subsequent detailed description and the appended claims, taken in conjunction with the accompanying drawings and the foregoing technical field and background.

SUMMARY

In one of various exemplary embodiments, a method is provided for diagnosing stator windings in an electric motor. In one of various embodiments, the method involves determining an input energy imbalance across phases of the stator windings for an electrical period of the electric motor and identifying a fault condition when the input energy imbalance is greater than a first threshold value.

According to another of various exemplary embodiments, an electrical system suitable for use with an automotive vehicle is also provided. In one embodiment, the system includes an electric motor having stator windings, each stator winding corresponding to a respective phase of the electric motor, an inverter module coupled to the stator windings to provide commanded voltages from an energy source to the stator windings of the electric motor in response to voltage commands corresponding to the phases of the electric motor, a plurality of current sensors coupled between the inverter module and the stator windings to obtain measured currents through the stator windings, and a control module coupled to the inverter module and the plurality of current sensors. The control module generates the voltage commands corresponding to the commanded voltages based on a difference between the measured currents and commanded currents, determines an input energy difference between phases of the electric motor based on the voltage commands and the measured currents, and identifies a fault condition in the stator windings based on the input energy difference.

DESCRIPTION OF THE DRAWINGS

The exemplary embodiments will hereinafter be described in conjunction with the following drawing figures, wherein like numerals denote like elements, and wherein.

DETAILED DESCRIPTION

Figure 1:
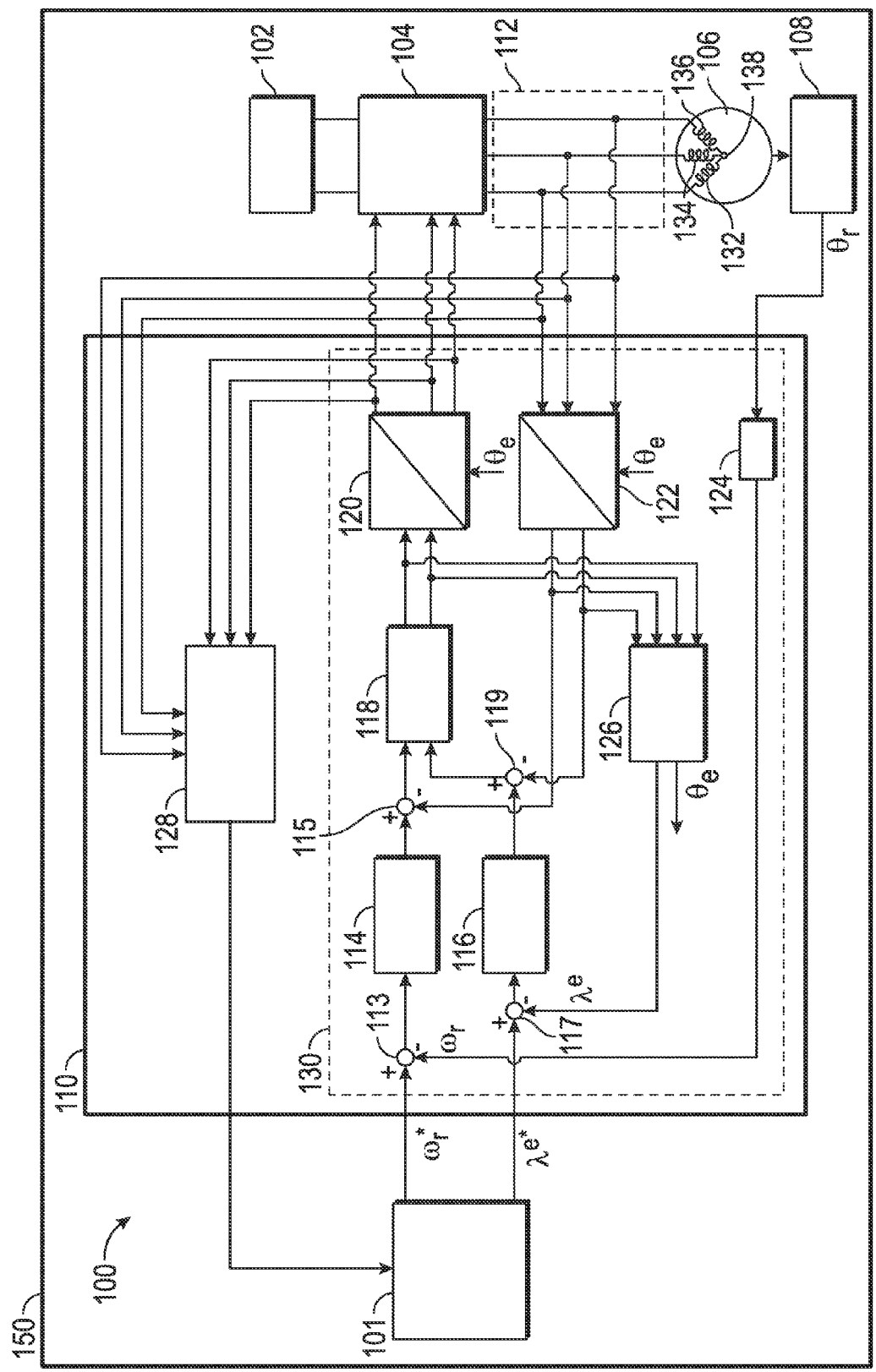
FIG. 1 is a block diagram of an exemplary electrical system suitable for use with a vehicle in accordance with an embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the subject matter described herein relate to diagnosing a fault condition in the stator windings of an electric motor based on input energy imbalances among phases of the electric motor. In this regard, for a healthy motor during normal operation, the expected motor phase currents are balanced and symmetrical, such that the input energy should be substantially equal across all motor phases over an electrical cycle. As described in greater detail below, in exemplary embodiments, the input energy metric (or value) is determined over an electrical cycle of an electric motor for each respective phase of the electric motor by accumulating instantaneous input power values for each respective phase that are determined at multiple sampling times during the electrical cycle. A value for the input energy imbalance over that electrical cycle is then determined as the maximal difference between input energies across the motor phases, for example, by subtracting the minimum motor phase input energy metric over the electrical cycle from the maximum motor phase input energy metric over the electrical cycle. A short-circuit stator winding fault condition is detected when the input energy imbalance exceeds a threshold value representative of a nominal maximal input energy imbalance for a healthy motor. Once a short-circuit stator winding fault condition is detected, the fault condition may be identified as being either an in-phase short-circuit fault condition or a phase-to-phase short-circuit fault condition based on the relationship between the maximum motor phase input energy metric and the minimum motor phase input energy metric, as described in greater detail below. By diagnosing the electric motor over each electrical cycle, an incipient fault condition may be identified in a limited amount a time, thereby allowing remedial actions to be quickly initiated to mitigate the effects of the fault condition on the electric motor.

In exemplary embodiments, the subject matter described herein utilizes a three-phase synchronous electric motor controlled by a variable-frequency drive that provides current-regulated closed-loop control of the speed and torque of the electric motor in an automotive vehicle, as described in greater detail below in the context of FIG. 1. That said, the subject matter described herein is not limited to use with synchronous motors, three-phase motors, variable-frequency and/or current-regulated closed-loop controlled motors, and/or automotive applications, and in practice, the subject matter described herein may be utilized with any multi-phase electric motor (e.g., an electric motor with more than one phase of stator windings) employed in any application.

As used herein, the meaning of subscription and superscription is as follows:

Subscript d and q: Quantity in the d-q frame. The d-q frame of reference, in Cartesian coordinates, is synchronous with the rotation of a characteristic of a rotor (e.g. the rotor flux angle) within the electric motor.

Superscript s: Quantity in the stator windings of the electric motor in the stationary reference frame.

Superscript e: Quantity in the rotating (synchronous) reference frame.

Superscript *: Quantity which is commanded.

Turning now to FIG. 1, an exemplary electrical system 100 suitable for use in an automotive vehicle 150 includes, without limitation, an electronic control unit (ECU) 101, an energy source 102, an inverter module 104, an electric motor 106, a resolver system 108, a control module 110, and a plurality of current sensors 112. The ECU 101 is responsive to commands received from the driver of the vehicle 150 (e.g., via an accelerator pedal) and generates corresponding speed ($\omega^*_r$) and rotor flux ($\lambda^{e^*}$) commands to operate the electric motor 106 of the vehicle 150 in the desired manner. The control module 110 is coupled to the ECU 101 to receive the speed and flux commands, and, in turn, generates a corresponding voltage command representing the voltage to be applied from the energy source 102 to the stator windings of the electric motor 106 via the inverter module 104 to achieve the commanded speed and rotor flux. In this regard, the inverter module 104 and control module 110 are cooperatively configured to employ pulse-width modulation (PWM) techniques to modulate phase legs of the inverter module 104 and apply or otherwise provide the commanded voltage from the energy source 102 to the electric motor 106. As described in greater detail below in the context of FIG. 2, in exemplary embodiments, the control module 110 identifies a fault condition in the stator windings of the electric motor 106 based on differences in the input energy being provided to different phases of the electric motor 106.

It should be understood that FIG. 1 is a simplified representation of an electrical system 100 for purposes of explanation and is not intended to limit the scope or applicability of the subject matter described herein in any way. In this regard, although FIG. 1 depicts the control module 110 and the inverter module 104 as distinct and separate elements, in practice, the control module 110 may be integral with (or incorporated) in the inverter module 104, or alternatively, the control module 110 may be integral with (or incorporated) in the ECU 101. Furthermore, although FIG. 1 depicts the number of current sensors being equal to the number of motor phases, in practice, fewer current sensors may be utilized relative to the number of motor phases. For example, two current sensors may be utilized with a three-phase motor, with the third motor phase current being calculated based on Kirchhoff's law, as will be appreciated in the art.

In exemplary embodiments, the vehicle 150 is realized as an automobile, and depending on the embodiment, the vehicle 150 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). The vehicle 150 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen and natural gas) fueled engine, a combustion/electric motor hybrid engine, and an electric motor. In alternative embodiments, the vehicle 150 may be a plug-in hybrid vehicle, a fully electric vehicle, a fuel cell vehicle (FCV), or another suitable alternative fuel vehicle.

In an exemplary embodiment, the energy source 102 (or power source) is capable of providing a direct current (DC) voltage to the inverter module 104 for operating the electric motor 106. Depending on the embodiment, the energy source 102 may be realized as a battery, a fuel cell, a rechargeable high-voltage battery pack, an ultracapacitor, or another suitable energy source known in the art. The inverter module 104 is coupled between the energy source 102 and the electric motor 106 and includes a power inverter configured to convert the DC power from the energy source 102 into alternating current (AC) power for driving the electric motor 106. In this regard, the inverter module 104 includes a plurality of phase legs, with each phase leg corresponding to a respective phase of the electric motor 106. Generally, switches of a phase leg are modulated (opened or closed) at a particular switching frequency to produce an AC voltage across its associated phase of stator windings of the electric motor 106, which, in turn, creates torque-producing current in those stator windings and operates the electric motor 106.

In one exemplary embodiment, the electric motor 106 is realized as an induction motor, however, the subject matter described herein should not be construed as being limited to use with any particular type of electric motor. In other embodiments, the electric motor 106 may be realized as an internal permanent magnet (IPM) motor, a synchronous reluctance motor, or another suitable motor known in the art. Although not illustrated in FIG. 1, the motor 106 may include a transmission integrated therein such that the motor 106 and the transmission are mechanically coupled to at least some of the wheels of the vehicle 150 through one or more drive shafts, so that the speed of the motor 106 influences the speed of the vehicle 150.

The electric motor 106 is realized as a multi-phase AC electric machine having a rotor and stator windings (or coils), wherein each set of stator windings corresponds to a different electrical phase of the motor 106. In the illustrated embodiment of FIG. 1, the motor 106 is realized as a three-phase AC motor having a three-phase set of windings including a first (e.g., phase A) stator winding 132, a second (e.g., phase B) stator winding 134, and a third (e.g., phase C) stator winding 136. It should be understood that the labeling of phases A, B, and C is for ease of description and is not intended to limit the subject matter in any way, and furthermore, the subject matter is not limited to three-phase machines and may be adapted for an electric motor having any number of phases. In the illustrated embodiment, the stator windings 132, 134, 136 are configured in a wye-connection, wherein an end of each winding is connected to ends of the other windings or otherwise terminates at a common node 138.

Still referring to FIG. 1, the electrical system 100 includes current sensors 112 coupled between the inverter module 104 and the electric motor 106 to measure the currents flowing from the inverter module 104 and through the respective phases of stator windings 132, 134, 136 of the electric motor 106. In this regard, a first phase current sensor is configured to measure the current flowing through the phase A winding 132 ($i_a^s$) (e.g., the phase A motor current), a second phase current sensor is configured to measure the current flowing through the phase B winding 134 ($i_b^s$) (e.g., the phase B motor current), and a third phase current sensor is configured to measure the current flowing through the phase C winding 136 ($i_c^s$) (e.g., the phase C motor current). In an exemplary embodiment, the resolver system 108 includes a resolver coupled to the electric motor 106, and the output of the resolver is coupled to a resolver-to-digital converter. The resolver (or similar sensing device) senses the position of the rotor ($\theta_r$) of the electric motor 106. The resolver-to-digital converter converts analog signals from the resolver to digital signals (e.g., a digital rotor position signal) which are provided to the control module 110.

The control module 110 generally represents the hardware of the electrical system 100 that is suitably configured to implement field-oriented control or current-regulated control of the electric motor 106 by controlling and/or operating the inverter module 104 to provide a commanded voltage from the energy source 102 to the electric motor 106. In this regard, the control module 110 is coupled to the current sensors 112 to obtain the measured currents through the stator windings 132, 134, 136 of the electric motor 106 from the current sensors 112, and the control module 110 regulates the current through the motor 106 to a commanded value by controlling the voltage provided from the energy source 102 to the motor 106. Thus, the commanded voltage is a current-regulated voltage, that is, a voltage configured to regulate currents in the stator windings 132, 134, 136 of the electric motor 106 to particular values.

Depending on the embodiment, the control module 110 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the control module 110 may be realized as a microprocessor, a controller, a microcontroller, a state machine, or the like. The control module 110 may also be implemented as a combination of computing devices, e.g., a combination of a digital signal processor and a microprocessor, a plurality of microprocessors, one or more microprocessors in conjunction with a digital signal processor core, or any other such configuration. In practice, the control module 110 includes processing logic that may be configured to carry out the functions, techniques, and processing tasks associated with the operation of the electrical system 100, as described in greater detail below. Furthermore, the steps of a method or algorithm described in connection with the embodiments disclosed herein may be embodied directly in hardware, in firmware, in a software module executed by the control module 110, or in any practical combination thereof.

In an exemplary embodiment, the control module 110 is implemented in the d-q synchronous reference frame, that is, the d-q axes of the reference frame rotate in lockstep with a reference characteristic of the rotor (e.g., the rotor position, the rotor flux angle) of the electric motor 106 such that rotation (or angular displacement) of the rotor characteristic produces a corresponding rotation (or angular displacement) of the d-q axes. In an exemplary embodiment, the control module 110 is implemented in the counterclockwise synchronous reference frame such that rotation of the rotor characteristic produces a corresponding counterclockwise rotation of the d-q axes. As shown in the illustrated embodiment of FIG. 1, in the case of an induction motor, the synchronous reference frame is determined relative to the rotor flux angle ($\theta_e$).

In the illustrated embodiment of FIG. 1, the control module 110 includes a speed regulator 114, a flux regulator 116, a current regulator 118, a voltage transformation block 120, a second transformation block 122, a speed calculator 124, a flux estimator 126, and a stator winding diagnostic block 128. The elements of the control module 110 are suitably configured to create a current-regulating control loop 130 (or alternatively, field-oriented control loop or current-controlled feedback loop), as described in greater detail below. In an exemplary embodiment, the stator winding diagnostic block 128 is coupled to the output of the voltage transformation block 120 to obtain stationary frame voltage commands corresponding to the instantaneous voltages applied to the respective phases of the electric motor 106, and the stator winding diagnostic block 128 is also coupled to the output of the current sensors 112 to obtain measured stationary frame currents flowing through the respective phases of the electric motor 106. As described in greater detail below in the context of FIG. 2, the stator winding diagnostic block 128 determines input energy metrics for the respective phases of the motor 106 over each electrical period (or cycle) of the motor 106 and detects or otherwise identifies a fault condition in the stator windings of the electric motor 106 based on the relative values of the respective phase input energy metrics over the electrical cycle. As used herein, the electrical period, electrical cycle, or any variants thereof should be understood as referring to the period of time equal to the inverse of the frequency of the AC voltage applied to the stator windings (e.g., the inverse of the motor electrical frequency), wherein the speed of the electric motor ($\omega_r$) is a multiple of the electrical frequency of the AC voltage supplied to the stator windings. In exemplary embodiments, the control module 110 operates at a sampling frequency that is at least ten times the electrical frequency of the electric motor 106, thereby allowing the stator winding diagnostic block 128 to obtain multiple samples of the voltages ($v_a^{s*}, v_b^{s*}, v_c^{s*}$) applied to the stator windings 132, 134, 136 of the electric motor 106 and the measured motor phase currents ($i_a^s, i_b^s, i_c^s$) through the stator windings 132, 134, 136 during an electrical cycle of the motor 106.

In the illustrated embodiment, a first summing junction 113 is coupled to the ECU 101 to receive the speed command ($\omega_r^*$) that represents a desired speed (or commanded speed) for the rotor of the electric motor 106. The first summing junction 113 is also coupled to the output of a speed calculator 124 that calculates or otherwise determines the observed (or measured) rotor speed ($\omega_r$) based on the change in rotor position ($\theta_r$) versus time. The first summing junction 113 determines the difference between the speed command ($\omega_r^*$) and the observed rotor speed ($\omega_r$) and provides the difference to the speed regulator 114. Based on the difference between the speed command ($\omega_r^*$) and the rotor speed ($\omega_r$), the speed regulator 114 determines and/or generates a q-axis synchronous frame current command ($i_q^{e*}$) (e.g., the torque-producing q-axis current command). The speed regulator 114 may be realized as a proportional-integral (PI) controller or another suitable element known in the art.

A second summing junction 117 is coupled to the ECU 101 to receive a flux command ($\lambda^{e*}$) that represents a desired rotor flux for the electric motor 106. The second summing junction 117 is also coupled to the output of the flux estimator 126, which calculates or otherwise estimates the rotor flux ($\lambda^e$) based on the relationship between the synchronous motor currents ($i_d^e$, $i_q^e$) and the synchronous motor voltages ($v_d^e$, $v_q^e$), as described in greater detail below. The second summing junction 117 determines the difference between the flux command ($\lambda^{e*}$) and the estimated rotor flux ($\lambda^e$) and provides the difference to the flux regulator 116. Based on the difference between the flux command and the estimated flux, the flux regulator 116 determines and/or generates a d-axis synchronous frame current command ($i_d^{e*}$) (e.g., the flux-producing d-axis current command). The flux regulator 116 may also be realized as a proportional-integral (PI) controller or another suitable element known in the art.

The current regulator 118 regulates the currents through the stator windings by generating and/or providing a voltage command for the inverter module 104 corresponding to the commanded voltages for the stator windings of the electric motor 106 such that the measured currents through the stator windings are regulated to or otherwise track the commanded motor current (or current command). In an exemplary embodiment, the current regulator 118 is realized as a synchronous frame current regulator configured to generate the voltage command in the synchronous reference frame ($v_d^{e*}$, $v_q^{e*}$) (alternatively referred to herein as the synchronous frame voltage commands) based on the difference between the commanded current ($i_d^{e*}$, $i_q^{e*}$) (alternatively referred to herein as the synchronous frame current command) and the measured motor current ($i_d^e$, $i_q^e$) (alternatively referred to herein as the synchronous frame motor current). In this regard, in accordance with one or more embodiments, a third summing junction 115 is coupled to the output of the speed regulator 114 and the output of the second transformation block 122 to determine a q-axis current error command ($i_{q\_err}^{e*}$) based on a difference between the q-axis current command ($i_q^{e*}$) and the measured q-axis motor current ($i_q^e$), and a fourth summing junction 119 is coupled to the output of the flux regulator 116 and the output of the second transformation block 122 to determine a d-axis current error command ($i_{d\_err}^{e*}$) based on a difference between the d-axis current command ($i_d^{e*}$) and the measured d-axis motor current ($i_d^e$). The current regulator 118 generates the synchronous frame voltage commands ($v_d^{e*}$, $v_q^{e*}$) based on the synchronous frame current error commands ($i_{d\_err}^{e*}$, $i_{q\_err}^{e*}$) which reflect the difference between the commanded current and the measured motor current expressed in the synchronous reference frame. In this regard, the current regulator 118 may be realized as a proportional-integral-derivative (PID) controller, a hysteresis current controller, a complex vector current regulator, or another suitable current-regulating element known in the art. It should be noted that in the absence of a fault condition within the stator windings 132, 134, 136, the current regulator 118 regulate the motor phase currents to be substantially balanced and symmetrical.

In an exemplary embodiment, the flux estimator 126 calculates or otherwise estimates rotor flux angle ($\theta_e$) for the rotor of the electric motor 106 based on the relationship between the synchronous motor current ($i_d^e$, $i_q^e$) and the synchronous motor voltage ($v_d^e$, $v_q^e$). In the illustrated embodiment of FIG. 1, the rotor flux angle ($\theta_e$) is utilized as a transformation angle for the control loop 130, that is, the angle used when transforming and/or translating a quantity in the synchronous reference frame to a corresponding quantity in the stationary reference frame, and vice versa (e.g., a 'dqo' or 'dq0' to 'abc' transformation, and vice versa). In alternative embodiments, the transformation angle may comprise the angular rotor position ($\theta_r$) or another suitable angular position. The output of the flux estimator 126 is configured to provide the estimated rotor flux angle ($\theta_e$) to the transformation blocks 120, 122. The second transformation block 122 is coupled to the current sensors 112 and configured to transform the measured stator currents from the stationary reference frame ($i_a^s$, $i_b^s$, $i_c^s$) to the synchronous reference frame ($i_d^e$, $i_q^e$) based on the transformation angle, i.e., the estimated rotor flux angle ($\theta_e$). In a similar manner, the voltage transformation block 120 is configured to transform the synchronous frame voltage commands ($v_d^{e*}$, $v_q^{e*}$) from the output of the current regulator 118 from the synchronous reference frame to the stationary reference frame based the estimated rotor flux angle ($\theta_e$), resulting in three-phase stationary frame voltage commands ($v_a^{s*}$, $v_b^{s*}$, $v_c^{s*}$) corresponding to commanded voltages for the respective phases of the stator windings 132, 134, 136 of the electric motor 106.

Still referring to FIG. 1, the inverter module 104 is configured to process the stationary frame voltage commands ($v_a^{s*}$, $v_b^{s*}$, $v_c^{s*}$) and generate PWM command signals for operating the phase legs of the power inverter to provide those commanded voltages to the respective phases of the stator windings in a conventional manner. In this regard, based on the assumption that the inverter module 104 is accurately reproducing the commanded voltages ($v_a^{s*}$, $v_b^{s*}$, $v_c^{s*}$) across the stator windings 132, 134, 136, the stator winding diagnostic block 128 may be coupled to the output of the voltage transformation block 120 to obtain the input voltages applied to the respective phases of stator windings 132, 134, 136 in lieu of using voltage sensors to sense the voltage across the stator windings 132, 134, 136 or performing other computationally intensive tasks to obtain the motor voltage. Similarly, the synchronous frame voltage commands ($v_d^{e*}$, $v_q^{e*}$) may be used by the flux estimator 126 to estimate the rotor flux ($\lambda^e$) and transformation angle ($\theta_e$) (e.g., $v_d^{e*} \approx v_d^e$, $v_q^{e*} \approx v_q^e$), by virtue of the fact that changes in the synchronous frame voltage commands ($v_d^{e*}$, $v_q^{e*}$) produce corresponding changes in stationary voltage commands, and thus, the duty cycles of the PWM commands used to modulate the switches of the inverter phase legs. However, it should be noted that in alternative embodiments, the electrical system 100 may include voltage sensors configured to measure the voltages across the respective phases of stator windings 132, 134, 136 of the motor 106, in which case, the stator winding diagnostic block 128 may be coupled to the voltage sensors to obtain the input voltages applied to the respective phases of stator windings 132, 134, 136 from the voltage sensors, and similarly, the flux estimator 126 may estimate the rotor flux based on synchronous motor voltages calculated by transforming stationary frame motor voltages measured by the voltage sensors.

Figure 2:
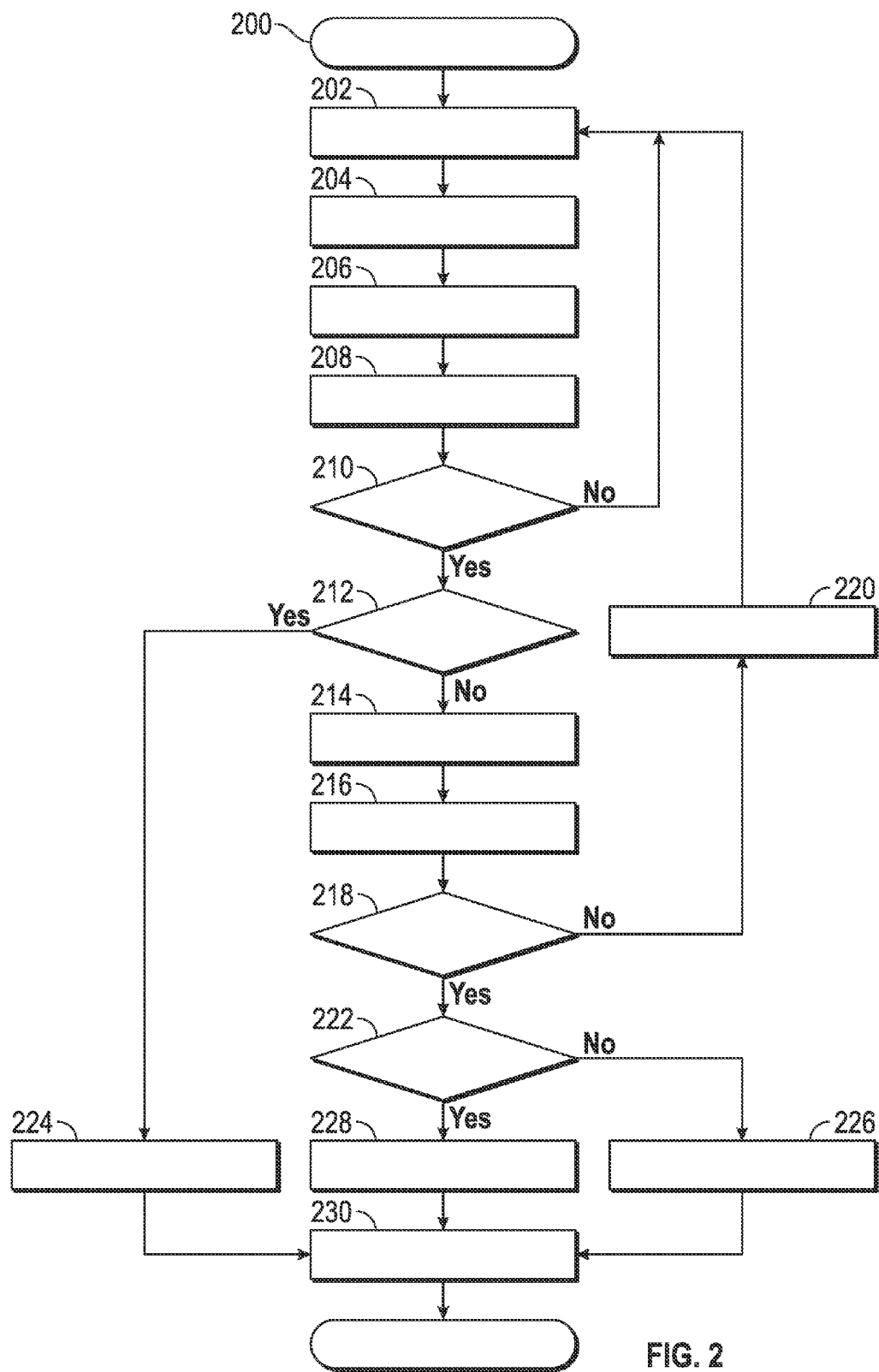
FIG. 2 is a flow diagram illustrating an exemplary stator windings diagnostic process suitable for implementation by the electrical system of FIG. 1 in accordance with an embodiment.

FIG. 2 depicts an exemplary embodiment of a stator windings diagnostic process 200 for detecting or otherwise identifying a fault condition in the stator windings of an electric motor. In exemplary embodiments, the stator windings diagnostic process 200 is performed by the control module 110 in the electrical system 100 of FIG. 1 to detect or otherwise identify a winding fault condition in the electric motor 106. The various tasks performed in connection with the illustrated process 200 may be performed by hardware, suitably configured analog circuitry, software executed by processing circuitry, firmware executable by processing circuitry, or any combination thereof. For illustrative purposes, the following description may refer to elements mentioned above in connection with FIG. 1. In practice, portions of the stator windings diagnostic process 200 may be performed by different elements of the electrical system 100, such as, for example, the ECU 101, the control module 110, and/or the stator winding diagnostic block 128. It should be appreciated that practical embodiments of the stator windings diagnostic process 200 may include any number of additional or alternative tasks, the tasks need not be performed in the illustrated order and/or the tasks may be performed concurrently, and/or the stator windings diagnostic process 200 may be incorporated into a more comprehensive procedure or process having additional functionality not described in detail herein. Moreover, one or more of the tasks shown and described in the context of FIG. 2 could be omitted from a practical embodiment of the stator windings diagnostic process 200 as long as the intended overall functionality remains intact.

In an exemplary embodiment, the stator windings diagnostic process 200 begins by obtaining the voltages applied to the respective phases of the electric motor at 202 and the currents flowing through the respective phases of the electric motor at an initial sampling time at 204. In this regard, at some initial time ($t_0$), the stator winding diagnostic block 128 samples or otherwise obtains the stationary frame motor voltages ($v_a^{s*}$, $v_b^{s*}$, $v_c^{s*}$) applied to the respective phases of stator windings 132, 134, 136 from the output of the voltage transformation block 120. Additionally, the stator winding diagnostic block 128 samples or otherwise obtains the stationary frame motor currents ($i_a^s$, $i_b^s$, $i_c^s$) through the respective phases of stator windings 132, 134, 136 from the current sensors 112 concurrently to obtaining the stationary frame motor voltages at that initial sampling time ($t_0$). In this manner, for each phase of stator windings 132, 134, 136, the stator winding diagnostic block 128 obtains an instantaneous voltage applied to that respective phase at the initial sampling time ($t_0$) and an instantaneous current concurrently flowing through that respective phase at the initial sampling time ($t_0$).

After obtaining the voltage applied to each respective phase of stator windings and the current through each respective phase of stator windings, the stator windings diagnostic process 200 continues at 206 by calculating or otherwise determining the instantaneous input power being delivered to each respective phase of stator windings based on the instantaneous voltage and current obtained for that respective phase of stator windings. For example, for the phase A windings 132, the stator winding diagnostic block 128 calculates the instantaneous input power being delivered to the phase A windings 132 at the initial sampling time ($t_0$) by multiplying the instantaneous voltage applied to the phase A windings 132 at the initial sampling time ($v_{a\_0}^{s*}$) by the instantaneous current through the phase A windings 132 at the initial sampling time ($i_{a\_0}^s$). In a similar manner, the stator winding diagnostic block 128 calculates the instantaneous input power for the phase B windings 134 ($v_{b\_0}^{s*} \times i_{b\_0}^s$) and the phase C windings 136 ($v_{c\_0}^{s*} \times i_{c\_0}^s$).

In exemplary embodiments, the stator windings diagnostic process 200 determines an input energy metric (or value) for each respective phase of stator windings over an electrical cycle at 208 by adding or otherwise accumulating the instantaneous input power values for that respective phase of phase of stator windings obtained during that electrical cycle. In this regard, at 210, the stator windings diagnostic process 200 determines whether the amount of time corresponding to the period of the electrical cycle of the motor 106 (e.g., $T_e$) has elapsed from the initial sampling time, and until the period of the electrical cycle has elapsed from the initial sampling time, the stator windings diagnostic process 200 repeats the steps of obtaining the voltages applied to the respective phases of the electric motor and the currents flowing through the respective phases of the electric motor at subsequent sampling times during the electrical cycle (at 202 and 204), calculating the corresponding instantaneous input power being delivered to each respective phase of stator windings at those subsequent sampling times (at 206), and adding the instantaneous input power values for the respective phases of the electric motor at those subsequent sampling times to the instantaneous input power values for the respective phases of the electric motor at preceding sampling times (at 208) to accumulate an input energy metric for each respective phase of the electric motor over the electrical cycle. For example, at a second sampling time ($t_1$) subsequent to the initial sampling time, the stator winding diagnostic block 128 obtains an instantaneous voltage applied to the phase A windings 132 from the voltage transformation block 120 ($v_{a\_1}^{s*}$), obtains an instantaneous current through the phase A windings 132 from the corresponding current sensor 112 ($i_{a\_1}^s$), calculates an instantaneous input power for the phase A windings 132 by multiplying the instantaneous voltage and current, and adds the instantaneous input power at the second sampling time to the input power at the initial sampling time to accumulate the input energy metric for the phase A windings 132 over the current electrical cycle (e.g., $E_a = v_{a\_0}^{s*} \times i_{a\_0}^s + v_{a\_1}^{s*} \times i_{a\_1}^s$). In this regard, the input energy metric for the phase A windings 132 ($E_a$) may be represented by the equation $$E_a = \sum_{t_0}^{t_0+T_e} (v_a^{s*} \times i_a^s),$$

where $T_e$ is the period of the electrical cycle of the motor 106 and $t_0$ is the initial sampling time. In a similar manner, the stator winding diagnostic block 128 accumulates input energy metrics for the phase B and phase C windings 134, 136 over the electrical cycle by adding the calculated instantaneous input power at each subsequent sampling time to the preceding value of the input energy metric for that respective phase. Thus, the input energy metric for the phase B windings 134 ($E_b$) may be represented by the equation $$E_b = \sum_{t_0}^{t_0+T_e} (v_b^{s*} \times i_b^s)$$

and the input energy metric for the phase C windings 136 ($E_c$) may be represented by the equation $$E_c = \sum_{t_0}^{t_0+T_e} (v_c^{s*} \times i_c^s).$$

Still referring to FIG. 2, in an exemplary embodiment, after an electrical cycle has elapsed at 210, the stator windings diagnostic process 200 continues by detecting or otherwise identifying a fault condition in the stator windings of the electric motor based on the values of the input energy metrics for the respective stator windings over the preceding electrical cycle. In the illustrated embodiment, the stator windings diagnostic process 200 identifies or otherwise determines whether the input energy metric for any phase of stator windings is equal to zero for the preceding electrical cycle, and in response to identifying that the value of the input energy metric for a phase of stator windings of the electric motor is equal to zero (within realistic and/or practical operating tolerances) over an electrical cycle at 212, the stator windings diagnostic process 200 identifies that phase of stator windings as having an open circuit fault condition at 224 and initiates a remedial action based on the open circuit fault condition at 230. In this regard, the output of the stator winding diagnostic block 128 is coupled to the ECU 101 to signal or otherwise indicate the open circuit fault condition in a particular phase of stator windings of the electric motor 106 having an input energy metric equal to zero at 212, wherein in response to receiving the indication of the open circuit fault condition in a particular phase of stator windings at 224, the ECU 101 takes remedial action at 230, for example, by generating modified speed and/or flux commands to cease operation of the electric motor 106 or otherwise operate the electric motor 106 safely, as described in greater detail below.

When the stator windings diagnostic process 200 determines that an open circuit fault condition does not exist within the electric motor at 212, the stator windings diagnostic process 200 continues by identifying maximal input energy imbalance across the motor phases over the electrical cycle and detecting a short circuit fault condition based on the magnitude of the input energy imbalance. For example, in the illustrated embodiment, the stator windings diagnostic process 200 identifies the motor phase having the greatest input energy over the preceding electrical cycle relative to the other motor phases at 214, identifies the motor phase having the least input energy over the preceding electrical cycle relative to the other motor phases at 216, and determines whether a difference between the value for the input energy metric of the motor phase having the maximum input energy and the value for the input energy metric of the motor phase having the minimum input energy is greater than a winding short circuit threshold value at 218. When the stator windings diagnostic process 200 determines that the maximal difference between input energies across the motor phases for the electrical cycle is less than the winding short circuit threshold value, the stator windings diagnostic process 200 determines or otherwise identifies the electric motor as being healthy and continues normal operation of the electric motor at 220. In exemplary embodiments, the stator windings diagnostic process 200 continuously monitors the input energy to the electric motor for a winding fault condition by repeating the tasks of obtaining motor phase voltages and currents, determining input energy metrics for the respective motor phases, and determining whether the input energy for any of the motor phases is equal to zero or whether a difference between input energies for any two of the motor phases exceeds the winding short circuit threshold value, as illustrated in FIG. 2.

As described above, for a healthy motor during normal operation, the motor phase currents are balanced and symmetrical, such that the motor phase input energy should be substantially equal across all motor phases. Thus, in the absence of a fault condition, the value of the input energy metric for the phase A winding 132 over an electrical cycle should be substantially equal to the value of the input energy metric for the phase B winding 134 over the electrical cycle, and also, substantially equal to the value of the input energy metric for the phase C winding 136 over the electrical cycle. However, the presence of a short circuit in the stator windings in one of the motor phases results in an imbalance in the input energy across the motor phases over an individual electrical cycle. Accordingly, the winding short circuit threshold value is chosen such that a difference between the input energy across motor phases over an individual electrical cycle indicates a winding short circuit fault condition in one of the motor phase windings. In other words, the threshold value is greater than the maximum input energy imbalance likely to be exhibited by a healthy motor. In this manner, the stator windings diagnostic process 200 detects or otherwise identifies winding short circuit fault condition in the stator windings of the electric motor based on the maximal difference in input energy between two phases of the electric motor at 218. For example, the maximal difference in input energy between two phases of the electric motor 106 may be represented by the equation $d=\max(E_a,E_b,E_c)-\min(E_a,E_b,E_c)$, where d is the maximal difference in input energies across all three motor phases of the electric motor 106, and a short circuit fault condition may be detected when $d>d_{SC}$, where $d_{SC}$ is the winding short circuit threshold value that is greater than the maximum input energy imbalance likely to be exhibited by electric motor 106 in the absence of a short circuit fault condition.

In exemplary embodiments, in response to detecting a difference in motor phase input energies during the electrical cycle that exceeds the winding short circuit threshold value at 218, the stator windings diagnostic process 200 continues at 222 by determining or otherwise identifying the type of stator winding short circuit condition based on an input energy ratio representative of the relative input energy imbalance among the phases of the electric motor that is determined using the maximum and minimum motor phase input energies during that electrical cycle. In this regard, the stator windings diagnostic process 200 detects or otherwise identifies a phase-to-phase short circuit condition in the electric motor when the ratio of the maximum motor phase input energy to the minimum motor phase input energy over the electrical cycle is greater than a phase-to-phase short circuit threshold value at 226, or alternatively, detects or identifies an in-phase short circuit when the ratio of the maximum motor phase input energy to the minimum motor phase input energy over the electrical cycle is less than the phase-to-phase short circuit threshold value at 228. In this regard, a phase-to-phase short circuit results in a greater imbalance in the electric motor, such that the ratio of the maximum motor phase input energy to the minimum motor phase input energy when a phase-to-phase short circuit condition exists in the electric motor is noticeably greater than the ratio of the maximum motor phase input energy to the minimum motor phase input energy when an in-phase short circuit condition exists in the electric motor. For example, for an electric motor operating at about 1000 revolutions per minute, the ratio of the maximum to minimum motor phase input energies when a phase-to-phase short circuit condition exists may be on the order of about ten times greater than the ratio of the maximum to minimum motor phase input energies for an in-phase short circuit condition with about 7% of the winding turns shorted and on the order of about five times greater than the ratio of the maximum to minimum motor phase input energies for an in-phase short circuit condition with about 50% of the winding turns shorted. Thus, the phase-to-phase short circuit threshold value is chosen to be greater than the greatest ratio likely to be observed for an in-phase short circuit condition within an electrical cycle. For example, the phase-to-phase short circuit value may be chosen to be about twice the ratio of the maximum to minimum motor phase input energies for an in-phase short circuit condition with about 50% of the winding turns shorted at the maximum allowable rotational speed of the electric motor (e.g., about 12,000 revolutions per minute).

Accordingly, when the maximal difference in input energies exceeds the winding short circuit threshold value and the ratio of the maximum motor phase input energy to the minimum motor phase input energy over the electrical cycle is greater than the phase-to-phase short circuit threshold value, a phase-to-phase short circuit fault condition is identified at 226, and conversely, when the maximal difference in input energies exceeds the winding short circuit threshold value but the ratio of the maximum motor phase input energy to the minimum motor phase input energy is less than the phase-to-phase short circuit threshold value, an in-phase short circuit fault condition is identified at 228. For an in-phase short circuit fault condition, the stator windings diagnostic process 200 may also identify the motor phase associated with the minimum input energy metric over the electrical cycle as the motor phase exhibiting the in-phase short circuit condition. Similarly, for a phase-to-phase short circuit fault condition, the stator windings diagnostic process 200 may identify the motor phases associated with the lesser input energy metrics over the electrical cycle as the motor phases exhibiting the phase-to-phase short circuit condition.

Referring to FIGS. 1-2, as described above, the output of the stator winding diagnostic block 128 is coupled to the ECU 101 to signal or otherwise indicate the type of short circuit fault condition that is detected based on the ratio between the maximum and minimum motor phase input energies. For example, when the maximal difference in input energies exceeds the winding short circuit threshold value and the ratio of the maximum motor phase input energy to the minimum motor phase input energy over the electrical cycle is less than the phase-to-phase short circuit value, the stator winding diagnostic block 128 may identify an in-phase short circuit fault condition to the ECU 101. In some embodiments, the stator winding diagnostic block 128 may also identify the motor phase associated with the minimum motor phase input energy as the motor phase exhibiting the in-phase short circuit condition, thereby allowing the electric motor 106 to be operated in a manner that mitigates the in-phase short circuit condition (e.g., by generating or otherwise providing modified voltage commands that increase the voltage applied to the healthy motor phases while reducing the voltage applied to the motor phase exhibiting the in-phase short circuit condition to prevent excessive current through the shorted motor phase and/or its corresponding phase leg of the inverter module 104) and/or accelerating any subsequent maintenance and/or repair by providing notification of the affected motor phase. Similarly, when the maximal difference in input energies exceeds the winding short circuit threshold value and the ratio of the maximum motor phase input energy to the minimum motor phase input energy over the electrical cycle is greater than the phase-to-phase short circuit value, the stator winding diagnostic block 128 may identify a phase-to-phase short circuit condition to the ECU 101. In some embodiments, the stator winding diagnostic block 128 may also identify the motor phases associated with the lesser motor phase input energies as the motor phases that are short circuited together.

Still referring to FIG. 2, in exemplary embodiments, the stator windings diagnostic process 200 continues by taking one or more remedial actions and/or other measures to ensure safe and/or effective operation of the vehicle based on the identified stator winding fault condition at 230. It should be appreciated that any number of remedial actions and various combinations thereof may be utilized in any practical embodiment, and the subject matter described herein is not limited to any particular type or number of remedial actions. In accordance with one or more exemplary embodiments, the stator windings diagnostic process 200 prevents operation of the electric motor in response to identifying the fault condition. For example, the control module 110 may generate modified voltage commands that are provided to the inverter module 104 to set all the switches of the inverter module 104 to an open state to prevent current flow from the energy source 102 to the stator windings 132, 134, 136, and thereby disable and/or cease operation of the electric motor 106. In another embodiment, the stator windings diagnostic process 200 and/or ECU 101 may be configured to physically restrict the movement of the rotor if a fault condition exists. In addition, the stator windings diagnostic process 200 may provide notification of a fault condition to the driver of the vehicle 150, for example, by the ECU 101 or another component in the vehicle 150 generating an audible and/or visual alert within the vehicle 150 (e.g., by turning on a check engine light).

In some embodiments, the stator windings diagnostic process 200 may take remedial action by operating the electric motor 106 with reduced capabilities, for example, by modifying the control scheme to limit the current through the electric motor 106 or by limiting the torque production and/or rotor speed. For example, in response to an open circuit fault condition or an in-phase short circuit fault condition in an individual motor phase, the control module 110 and/or the ECU 101 may implement a modified control scheme that results in a commanded voltage of zero for that identified motor phase, to thereby prevent current flow from the energy source 102 to the motor phase exhibiting the fault condition. In this manner, the stator windings diagnostic process 200 may mitigate the fault condition in the electric motor 106 by operating the motor 106 with reduced capabilities based on the motor phase identified by the stator winding diagnostic block 128 as exhibiting a fault condition.

To briefly summarize, one advantage of the systems and/or methods described above is that the stator windings of an electric motor may be diagnosed while the electric motor is being operated, without having to perform Fourier transform analysis or other computationally intensive frequency-domain analysis, and without injecting signals that could potentially affect operation of the motor. An incipient short circuit fault condition may be readily identified within a few electrical cycles, thereby allowing remedial action to be swiftly taken to mitigate the short circuit fault condition. Furthermore, based on the input energy imbalance across the motor, the type of short circuit fault condition may be identified, thereby allowing subsequent maintenance to focus on addressing the identified type of short circuit fault condition rather than dedicating maintenance resources to determining the type of fault condition.

For the sake of brevity, conventional techniques related to motor construction, motor controls, power conversion, sampling, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. Additionally, the foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof. Accordingly, details of the exemplary embodiments or other limitations described above should not be read into the claims absent a clear intention to the contrary.

What is claimed is:

1. A method for diagnosing stator windings in an electric motor, the method comprising:
    determining, by a control module coupled to a first module coupled between the electric motor and an energy source, an input energy difference between a first phase of the stator windings and a second phase of the stator windings for an electrical period of the electric motor;
    determining, by the control module, an input energy ratio for the first phase with respect to the second phase for the electrical period when the input energy difference is greater than a first threshold value; and
    identifying, by the control module, a phase-to-phase short circuit fault condition when the input energy ratio is greater than a second threshold value.

2. The method of claim 1, wherein determining the input energy difference comprises determining a maximal input energy difference among respective pairs of phases of stator windings of the electric motor.

3. The method of claim 1, further comprising phase, wherein identifying the fault condition comprises:
    identifying an in-phase short circuit fault condition when the input energy difference is greater than the first threshold value and the input energy ratio is less than the second threshold value.

4. The method of claim 1, wherein determining the input energy difference further comprises:
    determining a first phase input energy metric for the first phase of stator windings over the electrical period;
    determining a second phase input energy metric for the second phase of stator windings over the electrical period; and
    determining the input energy difference as a difference between the first phase input energy metric and the second phase input energy metric.

5. The method of claim 4, wherein:
    determining the first phase input energy metric further comprises accumulating a first plurality of instantaneous input power values for the first phase during the electrical period; and
    determining the second phase input energy metric further comprises accumulating a second plurality of instantaneous input power values for the second phase during the electrical period.

6. The method of claim 5, wherein accumulating the first plurality of instantaneous input power values further comprises:
    calculating a first instantaneous input power value for the first phase based on a first instantaneous voltage applied to the first phase and a first instantaneous current through the first phase at a first time during the electrical period;
    calculating a second instantaneous input power value for the first phase based on a second instantaneous voltage applied to the first phase and a second instantaneous current through the first phase at a second time during the electrical period; and
    adding the first instantaneous input power value and the second instantaneous input power value.

7. The method of claim 5, wherein accumulating the first plurality of instantaneous input power values further comprises:
    obtaining an instantaneous voltage applied to the first phase at a first time during the electrical period;
    obtaining an instantaneous current through the first phase at the first time during the electrical period;
    calculating an instantaneous input power value for the first phase based on the instantaneous voltage and the instantaneous current; and
    adding the instantaneous input power value to a preceding instantaneous input power value to obtain the first phase input energy metric.

8. The method of claim 1, further comprising:
    obtaining a first voltage command for the first phase of stator windings at a first time during the electrical period;
    obtaining a second voltage command for the second phase of stator windings at the first time;
    obtaining a first measured current through the first phase at the first time; and
    obtaining a second measured current through the second phase at the first time, wherein determining the input energy difference further comprises:
        determining a first phase input energy metric for the first phase based at least in part on the first voltage command and the first measured current;
        determining a second phase input energy metric for the second phase based at least in part on the second voltage command and the second measured current; and
        determining the input energy difference as a difference between the first phase input energy metric and the second phase input energy metric.

9. An electrical system comprising:
    an electric motor having stator windings, each stator winding corresponding to a respective phase of the electric motor;
    an inverter module coupled to the stator windings to provide commanded voltages from an energy source to the stator windings of the electric motor in response to voltage commands corresponding to the phases of the electric motor;
    a plurality of current sensors coupled between the inverter module and the stator windings to obtain measured currents through the stator windings; and
    a control module coupled to the inverter module and the plurality of current sensors to:
        generate the voltage commands corresponding to the commanded voltages based on a difference between the measured currents and commanded currents;
        determine an input energy difference between a first phase of the stator windings and a second phase of the stator windings based on the voltage commands and the measured currents for an electrical period of the electric motor;

determine an input energy ratio for the first phase with respect to the second phase for the electrical period when the input energy difference is greater than a first threshold value; and identify a fault condition in the stator windings based on the input energy ratio and a second threshold value.

10. The electrical system of claim 9, wherein the input energy difference comprises a maximal input energy difference among the phases of the electric motor.

11. The electrical system of claim 9, wherein the control module:

identifies the fault condition as a phase-to-phase short circuit fault condition when the input energy difference is greater than the first threshold value and the input energy ratio is greater than the second threshold value; and identifies the fault condition as an in-phase short circuit fault condition when the input energy difference is greater than the first threshold value and the input energy ratio is less than the second threshold value.

12. The electrical system of claim 9, wherein the control module determines the input energy difference by:

determining an input energy value for each phase of the phases over an electrical period of the electric motor, resulting in a plurality of input energy values;

identifying a maximum input energy value of the plurality of input energy values;

identifying a minimum input energy value of the plurality of input energy values; and subtracting the minimum input energy value from the maximum input energy value to determine the input energy difference.

13. The electrical system of claim 9, further comprising an electronic control unit coupled to the control module to receive indication of the fault condition from the control module and initiate a remedial action in response the fault condition.

14. A method for diagnosing stator windings in an electric motor, the method comprising:

determining, by a control module coupled to a first module coupled between the electric motor and an energy source, a first motor phase input energy metric for a first phase of the stator windings of the electric motor for an electrical period of the electric motor by accumulating a first plurality of instantaneous input power values for the first phase during the electrical period;

determining, by the control module, a second motor phase input energy metric for a second phase of stator windings of the electric motor for the electrical period of the electric motor by accumulating a second plurality of instantaneous input power values for the second phase during the electrical period, wherein each respective instantaneous input power value of the second plurality is concurrent to a respective instantaneous input power value of the first plurality;

determining, by the control module, an input energy ratio for the first phase with respect to the second phase for the electrical period when an input energy difference between the first motor phase input energy metric and the second motor phase input energy metric is greater than a first threshold value; and identifying, by the control module, a short circuit fault condition based on the input energy ratio and a second threshold value when the difference between the first motor phase input energy metric and the second motor phase input energy metric is greater than the first threshold value.

15. The method of claim 14, wherein identifying the short circuit fault condition comprises:

identifying a phase-to-phase short circuit fault condition when the input energy ratio is greater than the second threshold value; and identifying an in-phase short circuit fault condition when the input energy ratio is less than the second threshold value.

16. The method of claim 14, wherein:

determining the first motor phase input energy metric further comprises:

obtaining a first voltage command for the first phase at a first time during the electrical period;

obtaining a first measured current through the first phase concurrently to obtaining the first voltage command;

obtaining a second voltage command for the first phase at a second time during the electrical period;

obtaining a second measured current through the first phase concurrently to obtaining the second voltage command; and determining the first motor phase input energy metric by adding a product of the first voltage command and the first measured current to a product of the second voltage command and the second measured current; and determining the second motor phase input energy metric further comprises:

obtaining a third voltage command for the second phase concurrently to obtaining the first voltage command;

obtaining a third measured current through the second phase concurrently to obtaining the third voltage command;

obtaining a fourth voltage command for the second concurrently to obtaining the second voltage command;

obtaining a fourth measured current through the second phase concurrently to obtaining the fourth voltage command; and determining the second motor phase input energy metric by adding a product of the third voltage command and the third measured current to a product of the fourth voltage command and the fourth measured current.

* * * * *